United States Patent [19]
Mehlkopf et al.

[11] Patent Number: 4,879,514
[45] Date of Patent: Nov. 7, 1989

[54] MAGNETIC RESONANCE IMAGING DEVICE COMPRISING A DIGITAL TRANSMITTER/RECEIVER

[75] Inventors: Antoon F. Mehlkopf; Johannes H. Den Boef, both of Eindhoven, Netherlands

[73] Assignee: U.S. Philips Corporation, New York, N.Y.

[21] Appl. No.: 196,534

[22] Filed: May 19, 1988

[30] Foreign Application Priority Data

May 19, 1987 [NL] Netherlands .......................... 8701195

[51] Int. Cl.⁴ ............................................ G01R 33/20
[52] U.S. Cl. .................................... 324/309; 324/314
[58] Field of Search ............... 324/300, 301, 302, 307, 324/309, 310, 311, 312, 313, 314, 318, 322; 128/653

[56] References Cited

U.S. PATENT DOCUMENTS

| | | | |
|---|---|---|---|
| 4,110,681 | 8/1978 | Hofer | 324/313 |
| 4,599,565 | 7/1986 | Hoenninger | 324/309 |
| 4,604,580 | 8/1986 | Sugiura | 324/314 |
| 4,654,597 | 3/1987 | Hino | 324/314 |
| 4,673,880 | 6/1987 | Compton | 324/309 |
| 4,677,382 | 6/1987 | Vatis | 324/307 |

Primary Examiner—Michael J. Tokar
Attorney, Agent, or Firm—Thomas A. Briody; Jack E. Haken; Jack D. Slobod

[57] ABSTRACT

The invention relates to a magnetic resonance imaging device comprising a transmitter/receiver which, with the exception of a few components is all digital. The transmitter comprises a digital frequency synthesizer, a single sideband modulator and a selective power amplifier, the single sideband modulator being controlled by a phase locked loop oscillator. The receiver comprises a selective pre-amplifier, a frequency mixing stage which is connected either to an output of the phase locked loop oscillator or to an output of the single sideband modulator, and an analog-to-digital converter which samples the output signal of the frequency mixing stage. The demodulation frequency for the receiver is chosen so that, after demodulation, a frequency band is obtained which is situated to one side of 0 Hz.

10 Claims, 3 Drawing Sheets

MAGNETIC RESONANCE IMAGING DEVICE COMPRISING A DIGITAL TRANSMITTER/RECEIVER

BACKGROUND OF THE INVENTION

1. Field of the Invention

The invention relates to a magnetic resonance imaging device, comprising a magnet system for generating a steady, uniform magnetic field and for generating magnetic gradient fields, an r.f. transmitter and receiver for generating and detecting magnetic resonance signals, and a processing and control unit for processing the detected resonance signals and for controlling the r.f. transmitter and receiver and the magnet system, the transmitter generating a transmission signal whose frequency deviates from the frequency of a reference signal to be applied to the receiver for demodulating a resonance signal generated by means of the transmission signal, there also being provided a sampling circuit for sampling the demodulated resonance signal.

2. Description of the Prior Art

A device of this kind is known from European patent application No. 0,165,057 corresponding to U.S. Pat. No. 4,654,597 to Hino. This European patent application describes the importance of a reliable and accurately operating r.f. transmitter and receiver. It also describes how the accuracy of a r.f. transmitter can be improved by using digital switching techniques for generating the modulation signal whereby the carrier is modulated. However, the r.f. receiver is still subject to drift and offset problems, because it may be assumed that it comprises the quadrature detection device customarily used for MRI applications. Drift and offset problems produce undesirable effects, for example stroke patterns, grey level shift etc., in the image to be ultimately reconstructed.

SUMMARY OF THE INVENTION

It is the object of the invention to provide a magnetic resonance imaging device which utilizes an r.f. transmitter/receiver which involves lower tuning costs, is easy to operate, can be manufactured at less costs, has a much greater reproducibility, and does not cause undesirable effects in an image to be reconstructed.

To achieve this, a magnetic resonance imaging device in accordance with the invention is characterized in that the reference signal applied to the receiver has a frequency such that the received magnetic frequency band of the resonance signal after demodulation by mixing with the reference signal and after sampling of the demodulated signal is situated to only one side of the frequency 0 Hz Fourier transformation then recovers frequency and phase information in each sequence. In order to allow the frequency and phase information in successive sequences to be interrelated. Means are also provided for retaining synchronization of phase information of the resonance signals in the successive measurement sequences.

The step which ensures that the frequency band of the resonance signal is situated to only one side of the frequency 0 Hz after sampling, ensures that that very low frequencies around 0 Hz, including 0 Hz itself, do not occur in the frequency band to be processed. As a result of said step, there will be no offset or drift problems. The sensitivity of the 0 Hz signal, causing a grey shift in the prior art reconstructed image due to crosstalk, is also eliminated.

The magnetic resonance imaging device in accordance with the invention comprises means for retaining or synchronizing phase information of the resonance signals in the successive measurement sequences. For the reconstruction of the distribution of nuclear magnetization in a region of an object, it is assumed that the resonance signals generated in the various measurement sequences always have the same phase (ignoring deliberately introduced phase differences, for example by gradient fields) at a given instant in the measurement sequence (for example, the instant of echo in the case of the spin echo technique). For example, when a measurement cycle is started by means of a trigger pulse derived from the phase of a signal which is obtained from a digital frequency synthesizer and which is mixed with a signal from a phase locked loop oscillator in order to generate a transmission signal, phase information can be retained. It is also possible to derive phase information from control signals used by a control unit for adjusting a digital frequency synthesizer (frequency and phase control signals), for example by means of the control unit, the phase information being used in the receiver for performing a necessary phase correction.

An embodiment of a magnetic resonance imaging apparatus in accordance with the invention is characterized in that the r.f. transmitter/receiver is a hybrid transmitter/receiver, the transmitter comprising not only a digital frequency synthesizer but also a digital-to-analog converter, a transmission frequency mixing stage, and an r.f. power amplifier which are connected in series, the receiver comprising a pre-amplifier, a reception frequency mixing stage, and an analog-to-digital converter, the transmission frequency mixing stage being connected to an output of a phase locked loop oscillator, the reception frequency mixing stage being connected either to the output of the phase locked loop oscillator or to the output of the transmission frequency mixing stage. In the magnetic resonance imaging apparatus in accordance with the invention, the use of analog parts for the digital transmitter and receiver is minimized, so that the costs of tuning will be lower (i.e. nill for the digital part), the transmitter and receiver can be tested in a simpler manner; it is even possible to automate these tests, so that the costs of testing are reduced. Moreover, the manufacturing costs will be lower and the r.f. signals generated can be processed with greater accuracy and reproducibility.

A preferred embodiment of a magnetic resonance imaging device in accordance with the invention is characterized in that the transmission frequency mixing stage is a single-sideband modulator which comprises a first and a second multiplier whose outputs are connected to an adder circuit, a first output of the first and the second multiplier receiving a reference signal having a first phase and a second phase, respectively, the phase difference between the reference signals amounting to 90°, a second input of the first multiplier and the second multiplier receiving a first and a second signal, respectively, from the digital synthesizer, the phase difference between the signals on the second inputs of the multipliers amounting to 90°, and one of the signals supplied by the synthesizer being invertable.

BRIEF DESCRIPTION OF THE DRAWING

The invention will be described in detail hereinafter with reference to the drawing; therein.

DETAILED DESCRIPTION OF THE PREFERRED EMBODIMENTS

Figure 1:
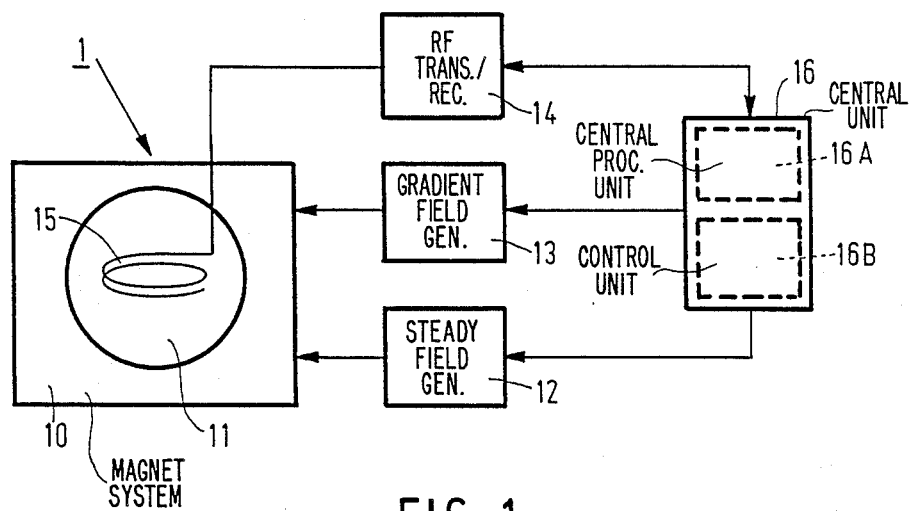
FIG. 1 shows a magnetic resonance imaging apparatus in accordance with the invention.

The magnetic resonance imaging apparatus shown in FIG. 1 comprises a magnetic system 10 for generating a steady, uniform magnetic field and for generating magnetic field gradients. These magnetic fields are generated in an examination space 11 which can accomodate an object, for example a patient. The magnet system 10 is controlled by generators 12 and 13, the generator 12 generating the steady magnetic field and the generator 13 generating one or more gradient magnetic fields, the gradient directions of which extend mutually perpendicularly. The magnetic resonance imaging device 1 also comprises a digital transmitter/receiver 14 which activates a transmitter/receiver coil 15. After activation of the coil 15, in the object 11 to be examined there are generated resonance signals which are detected by the coil 15 which then operates as a receiver coil and which are applied to the receiver in the transmitter/receiver 14. The detected resonance signals are applied to a central unit 16 in digital form. The generating, detection and digitizing of the magnetic resonance signals by the receiver 14 will be described in detail hereinafter. The unit 16 not only comprises a central processing unit 16a but also a control unit 16b which controls the generators 12 and 13 as well as the transmitter/receiver 14 and which also synchronizes their operation. The magnet system 10 may be a resistance coil or a super-conducting coil which is in that case controlled by the generator 12. However, the magnet system 10 may also comprise a permanent magnet for generating a steady, uniform magnetic field. In the latter case, of course, the generator 12 will not be required.

Figure 2:
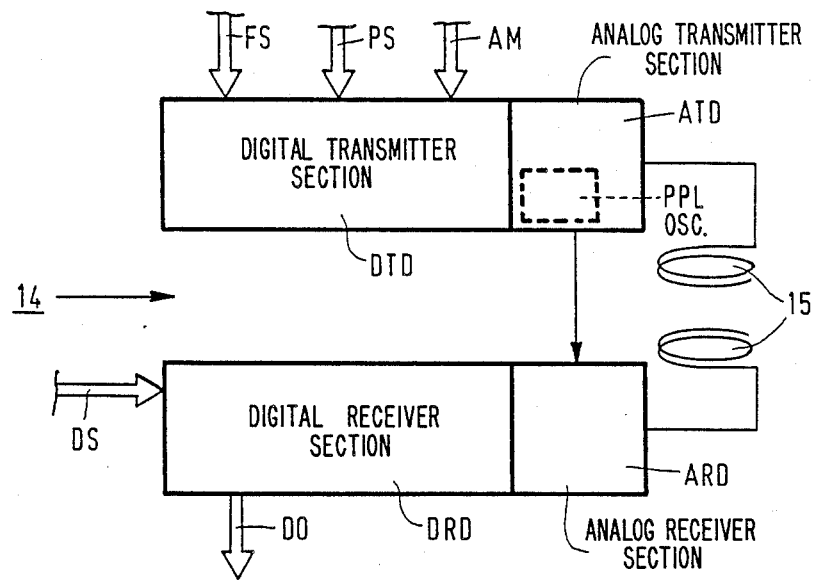
FIG. 2 shows a digital transmitter/receiver in accordance with the invention.

FIG. 2 shows an embodiment of a digital transmitter/receiver 14 in accordance with the invention. The digital transmitter/receiver 14 comprises a digital transmitter section DTD, an analog transmitter section ATD, an analog receiver section ARD and a digital receiver section DRD. The analog transmitter section ATD is connected to the r.f. coil 15 for generating an r.f. magnetic field. The analog receiver section ARD is also connected to the r.f. coil 15 in order to receive magnetic resonance signals. The r.f. magnetic coil 15 may be a single coil whereto the receiver ARD as well as the transmitter ATD is connected, but may alternatively comprise two separate coils.

The digital transmitter section DTD comprises three inputs: a first input FS for frequency adjustment, a further input PS for phase adjustment of the r.f. signal, and an input AM for modulating the amplitude of the r.f. signal. The analog section ATD comprises a phase locked loop oscillator PLL, an output of which is connected to an input of the analog receiver section ARD for adjusting the r.f. transmitter and receiver stages with respect to one another. The analog transmitter section ATD also comprises a mixing stage which receives the signals from the digital transmitter section DTD and from the phase locked loop oscillator PLL. The output signal of the mixing stage can also be applied to the analog receiver section ARD. This will be described in detail hereinafter. The digital receiver section DRD comprises a digital signal output DO.

Figure 3:
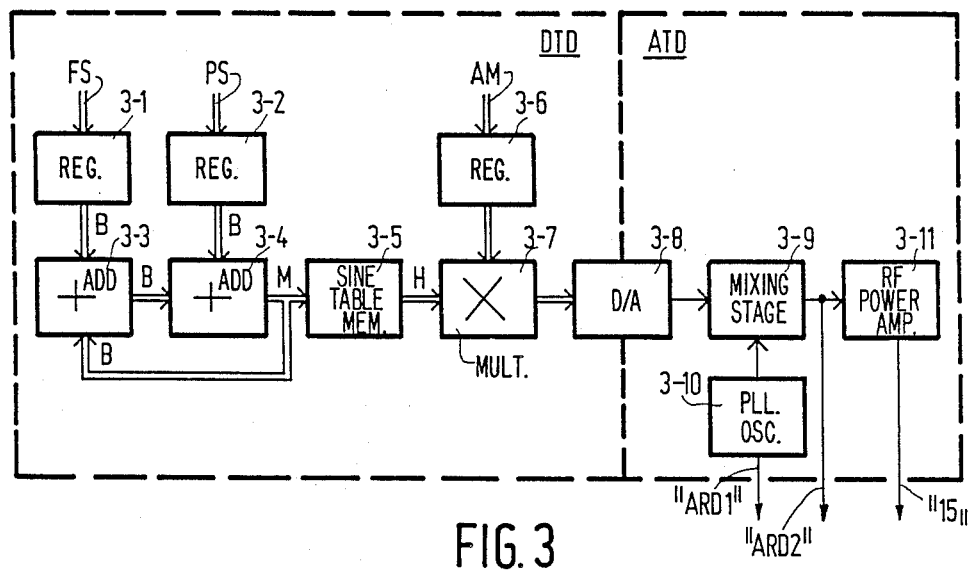
FIG. 3 and 4 show the digital transmitter and receiver, respectively, of FIG. 2 in greater detail

FIG. 3 is a more detailed representation of the digital transmitter DTD, ATD shown in FIG. 2. The digital section DTD of the transmitter comprises a first, a second, and a third register 3-1, 3-2, 3-6, respectively, whose functions will be described in detail hereinafter. The digital transmitter section DTD also comprises a first and a second adder, 3-3 and 3-4, respectively. The first and the second register 3-1 and 3-2 have their output connected to the input of the adders 3-3 and 3-4, respectively. An output of the adder 3-3 is connected to the adder 3-4 whose output is connected to a further add input of the adder 3-3 as well as to the input of a memory 3-5. A sinusoidal function is stored in the memory 3-5. The output of the memory 3-5 is connected to a multiplier 3-7, a further input of which is connected to the output of the third register 3-6. The output of the multiplier 3-7 is connected to the input of a digitaltoanalog converter 3-8 whose output is connected to a transmission freuqency mixing stage 3-9. A further input of the transmission frequency mixing stage 3-9 is connected to an output of a phase locked loop oscillator 3-10, a further output "ARD1" of which can be connected to the analog receiver section ARD. The output "ARD2" of the transmission frequency mixing stage 3-9 is connected to an input of a power amplifier 3-11, the output of which is connected to the r.f. coil 15.

The operation of the digital transmitter as shown in FIG. 3 is as follows. In the adder 3-3 the digital number stored in the register 3-1 is added to the digital number present on the output of the adder 3-4. The addition of these two digital numbers is applied to the first input of the adder 3-4 which adds the digital number stored in the register 3-2 on a further input. The sum supplied by the adder 3-4 serves as an address for the sine table (LUT=Look Up Table) stored in the memory 3-5. Assuming that the number zero is stored in the register 3-2 and that the digital number 1 is stored in the register 3-1, the number appearing on the output of the adder 3-4 will be incremented by 1 after each addition, so that a table stored in the memory 3-5 will be traversed step by step. When a number larger than 1 is stored in the register 3-1, the successive numbers on the output of the adder 3-4 will each time be incremented by that number during the successive additions, so that the sine table stored in the memory 3-5 will be traversed more quickly. As a result, a sinusoidal signal having a higher frequency is generated on the output of the memory 3-5. The number stored in the register 3-1 thus determines the frequency on the output of the memory 3-5. When an extra number which is stored in the register 3-2 is added once in a cycle of additions as described above, the regular traversing of the sine table in the memory 3-5 is disturbed once, which means that actually a phase jump occurs in the sinusoidal signal generated on the output of the memory 3-5. Using the described configuration, on the output of the memory 3-5 there can be generated a sinusoidal signal in which jumps can occur in its frequency as well as in its phase. These jumps can be realized by changing the contents of the register 3-1 and 3-2, respectively, via the frequency adjustment input FS and the phase adjustment input PS, respectively. If, during the cycle of additions, the number stored in register 3-1 is changed (increased or decreased) after each addition, an FM signal will be generated at the output of the memory 3-5.

The output of the memory 3-5 is connected to a first input of the multiplier 3-7 whose other input is connected to the register 3-6. In the register 3-6 there is stored a number which is a measure of the amplitude of the sinusoidal signal applied to the digital-to-analog converter 3-8 via the output of the multiplier 3-7. It is to be noted that the output of the multiplier 3-7 and the output of the digital-to-analog converter 3-8 output a signal in digital form and analog form, respectively, which may have been modulated as regards frequency, phase as well as amplitude. In the transmission frequency mixing stage 39 this signal is modulated with the r.f. signal of the phase locked loop oscillator 3-10. The output of the transmission frequency mixing stage 3-9 is applied to the selective r.f. power amplifier 3-11. The digital frequency synthesizer generates signals having frequencies up to 1000 kHz which are mixed with the signal of the PLL oscillator 3-10 by the transmission frequency mixing stage 3-9, so that the output signal assumes a frequency which is suitable for magnetic resonance imaging (for example, 63.86 MHz for proton examinations using a strength of 1.5 T of the static magnetic field). Depending on the type of mixing stage 3-9 used, the power amplifier 3-11 should be a selective preamplifier or not. When the frequency mixing stage 3-9 is a single sideband modulator with an image reject mode, the amplifier 3-11 need not be selective.

Figure 4:
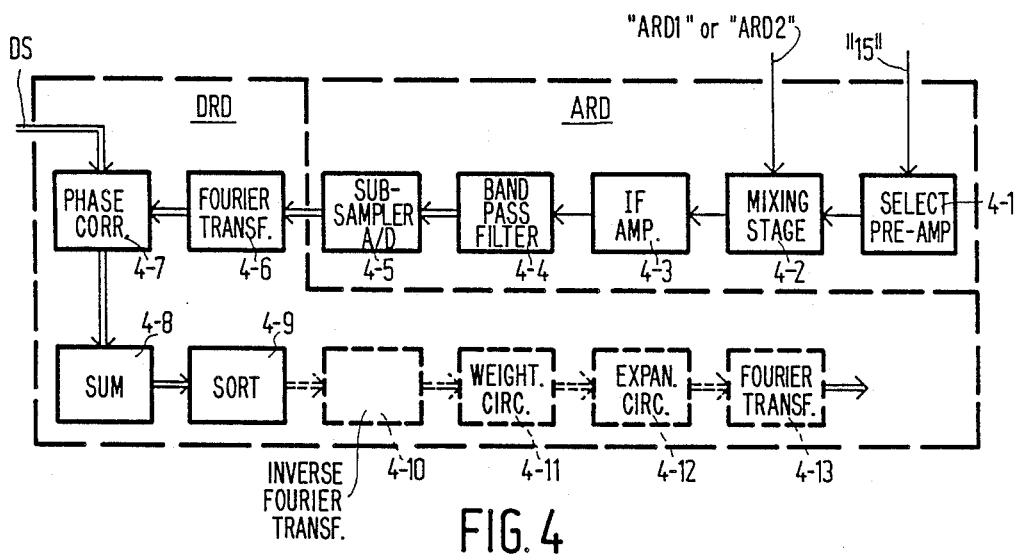

FIG. 4 is a more detailed representation of a digital receiver as shown in FIG. 2. The analog receiver section ARD comprises a selective pre-amplifier 4-1, a reception frequency mixing stage 4-2, an intermediate frequency amplifier 4-3, a frequency bandpass filter 4-4, and an analog-to-digital converter 4-5. The input of the pre-amplifier 4-1 is connected to the r.f. detection coil 15. The spin resonance signals detected by the r.f. coil 15 and amplified by the pre-amplifier 4-1 are applied to the mixing stage 4-2, a second input of which receives either the r.f. signal from the phase locked loop oscillator 3-10 or the r.f. output signal of the mixing stage 3-9. The intermediate frequency signal generated on the output of the mixing stage 4-2 is amplified by the amplifier 4-3, filtered by the bandpass filter 4-4 and applied to the analog-to-digital converter 4-5. The digital signals originating from the analog-todigital converter 4-5 are applied to a Fourier transformation circuit 4-6. The Fourier transformation circuit 4-6 transforms the signals from the time domain into signals in a frequency domain. The Fourier transformation circuit 4-6 is also capable of generating the desired frequency band from the available, sorted signal samples. These frequency signals are applied to a phase correction circuit 4-7 which receives phase correction signals via a connection DS to the control unit 16b. The foregoing will be described in detail hereinafter. After phase correction, these frequency signals are applied to a summing circuit 4-8 which determines a mean value from the associated frequency signals.

The receiver circuit DRD also comprises a sorting circuit 4-9 which arranges the successively obtained spectra in a sequence to be selected. This is because the sequence of the measurement sequences need not correspond to the sequence in which the spectra are processed. For example, for determining a two-dimensional image, the sequence of the spectra for processing is fixed by the time integral of the strength of a preparatory gradient magnetic field during a preparation period elapsing between the transmission of r.f. energy and the reception of the resonance signal. The sequence extends in steps from a minimum value of the integral to a maximum value (or vice versa). The measurement sequences need not necessarily be performed in that sequence.

Via an inverse fast Fourier transformer 4-10, the sorted spectra are converted into time signals again, after which the time signals are weighted in weighting circuit 4-11 in order to reduce the effects of noise on the signals by multiplying the parts of the signals that have a low signal-to-noise ratio by a weighting factor smaller than 1.

In the expansion circuit 4-12 a corresponding number of zero digits are padded to the time signals consisting of a distinct number of amplitude values. As a result of this operation, a ficticiously higher resolution will be obtained in the subsequent Fourier transformation in the circuit 4-13 (a larger number of picture points is obtained, but the spatial resolution of the information in the reconstructed image is not increased).

The output 4-14 of the Fourier transformer 4-13 supplies an image of a measured nuclear magnetization distribution; this may be a spin density distribution but also a (spatially defined) spectrum.

A further possibility for the processing of the detected spin resonance signals is realized by connecting the input "3-10" of the frequency mixing stage 4-2 to the output "ARD2" of the single sideband modulator 3-9 (See FIG. 3) of the analog transmitter section ARD.

The operation of the transmitter/receiver shown in FIGS. 3 and 4 when the second input of mixing stage 4-2 receives the r.f. signal from phase locked loop oscillator 3-10, is as follows. The transmitter section DTD generates a frequency of 300 kHz and the oscillator PLL generates a frequency of 63.56 MHz. In the object a slice is selected by means of a gradient magnetic field $G_z$ (gradient in the z-direction) for z is zero (the resonance frequency is 63.86 MHz in a 1.5 T magnet system). It is assumed that the resonance signal is detected in the presence of a gradient magnetic field $G_y$ which results in a bandwidth of 100 kHz. The signal received by the coil 15 will be between the frequencies 63.81 MHz and 63.91 MHz. IN the receiver section ARD the signal is mixed in the mixing stage 4-2 with the signal of the oscillator PLL. The output signal of the mixing stage 4-2 has a frequency band which is situated between 250 kHz and 350 kHz. After having passed the intermediate frequency amplifier 4-3 and the bandpass filter 4-4, this signal is sub-sampled with a frequency of 243 kHz by an analog-to-digital converter 4-5. Due to backfolding effects caused by the sub-sampling, a signal having a freuqency band between 7 and 107 kHz is generated on the output of the analog-to-digital converter 4-5. As a result of the foregoing, the information of the resonance signal will be situated to one side of 0 Hz and upon reception of the resonance signal the transmitter will be tuned to a frequency which is situated outside the frequency band received, so that no crosstalk will occur.

In another embodiment in accordance with the invention, the output signal of the frequency mixing stage 3-9 is applied to the frequency mixing stage 4-2 in the receiver ARD. If no further steps were taken, upon reception of a resonance signal, the output signal would have a frequency band situated around the frequency 0 Hz. In accordance with the invention, upon changing over from transmission to reception, a jump is made in the frequency of the signal generated by the digital synthesizer DTD. The extent of the jump amounts to half the bandwidth of the resonance signal to be detected, increased by a constant value Δ, for example 5 or 10 kHz. As a result, for a bandwidth of 90 kHz and a value Δ=5 kHz, the frequency in the digital transmitter section DFD will jump by 50 kHz. The output of the mixing stage 4-2 has a frequency range of from 5 to 95 kHz. For each measurement sequence the bandpass filter 4-4 may be the same and, unlike in prior art, it need not be adapted to a measurement. The analog-to-digital converter 4-5 can perform a normal sampling operation with a frequency of 200 kHz. It is to be noted that in the case of multiple-slice techniques the frequency jump in the digital transmitter section DFD amounts to Δ+½ (signal band width)+offset frequency; for example Δ=5 kHz.

½ (signal bandwidth)=45 kHz.

Offset frequency=γ.z. $G_z$, z being the position of the selected slice. It will be apparent from the foregoing that the output signal of the mixing stage 4-2 can thus always be maintained within the same frequency band; this is very advantageous.

The phase correction circuit 4-7 shown in FIG. 4 is not always necessary. Each measurement cycle is started with the same phase of the signal to be generated by the digital transmitter section (in other words, the measurement cycle is triggered by the phase of the DTD), the phase difference between the resonance signals (for example, at the instant of echo in the case of the spin echo technique) will always amount to an integer number of times $2\pi$.

If the foregoing is not used, the control unit 16b can determine the extent of the phase difference DS in the successive resonance signals from the successive control signals FS and PS applied to the digital transmitter section DTD, said phase difference DS being applied to the phase correction circuit as a control signal.

Figure 5:
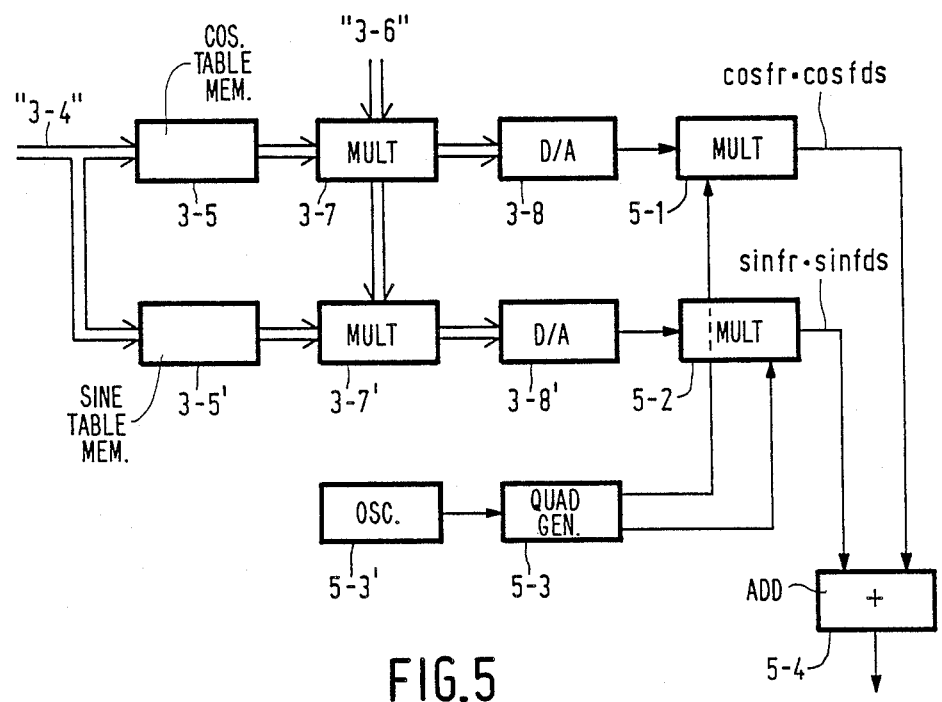
FIG. 5 shows a preferred embodiment of a part of the digital transmitter.

If the frequency mixing stage 3-9 is formed by a single-sideband modulator, a digital transmitter can be attractively used in a configuration as shown in FIG. 5. The frequency mixing stage 3-9 comprises a first multiplier 5-1 and a second multiplier 5-2, a phase shifter circuit 5-3, and an adder circuit 5-4. A reference signal having the frequency fr is applied to the phase shifter circuit 5-3. A first input of the phase shifter circuit supplies a signal (cosine ($2\pi$. fr.t)) whose phase deviates 90° from the signal (sine ($2\pi$.fr.t)) supplied by a second output. The outputs of the first multiplier 5-1 and the second multiplier 5-2 are applied to the adder circuit 5-4. A second input of the multipliers 5-1 and 5-2 receives the signal having the frequency fds which is generated by the digital synthesizer, the phase difference of the signals applied to the first and the second multiplier amounting to either 90° or −90°. The multiplier 5-1 receives the cosine function of the signal having the reference frequency and also the cosine function of the signal having the frequency fds which is generated by the digital synthesizer. The multiplier 5-2 receives the sine function of the reference frequency signal generator 5-3, 5-3', where 5-3' is the oscillator of the reference frequency signal fr, and also receives the sine function of the signal of the digital synthesizer which has the frequency fds. The produce formed by the multiplier 5-1:cos(fr).cos(fds) equals cos(fr-fds) +(fr+fds). The product signal supplied by the multiplier 5-2 equals cos(fr-fds) -cos(fr+fds). The sum of the two signals is a signal having the function cos(fr-fds). Alternatively, a signal having a frequency equal to the difference between the freuqencies fr and fds can be obtained by using a subtraction circuit instead of an adder circuit. However, a change-over from addition to subtraction would then be necessary, which change-over requires additional hardware.

The cosine function and the sine function of the signal having the frequency fdr, being applied to the multipliers 5-1 and 5-2, respectively, are generated as follows. In addition to the look-up table 3-5 given in FIG. 5, use is made of a further look-up table 3-5' in which a sine table is stored, a cosine table being stored in the look-up table 3-5. Using the same address, supplied by the register 3-4 (see FIG. 2), a cosine function and a sine function are simultaneously looked up in the tables 3-5 and 3-5', respectively. These functions are applied to a multiplier 3-7 and a multiplier 3-7', respectively. From the register 3-6 (see FIG. 3), the multipliers 3-7 and 3-7' receive the value whereby the function values applied to the multipliers 3-7 and 3-7' must be multiplied. The multiplication results are applied to the digital-to-analog converters 3-8 and 3-8' whose output is connected to the inputs of the multipliers 5-1 and 5-2, respectively.

It will be apparent that the amount of hardware shown in FIG. 5 can be reduced. Instead of two look-up tables, two multipliers and two digital-to-analog converters, use can be made of one demultiplexer circuit, a first input of which receives an address from the register 3-4 whilst a second input receives a further address which is derived from the former address. The further address can be derived in a simple manner in that the signal values to be looked up in the table must always be 90° removed from one another. Using these two addresses, each time a cosine value and a sine value are successively read from the table, which values are successively presented to the multipliers 5-1 and 5-2 via the multipliers 3-7 and 3-8 and a further multiplex circuit connected thereto.

The embodiment shown in FIG. 5 offers the advantage that positive as well as "negative" frequencies can be generated, i.e. the frequency band generated by the single-sideband may be situated above as well as below the frequency fr applied to the modulator.

We claim:

1. A magnetic resonance imaging device comprising a magnet system for generating a steady, uniform magnetic field and gradient magnetic fields in a measurement space, a transmitter/receiver including a transmitter section for generating modulated RF signals for exciting magnetic resonance signals in said measurement space in successive measurement sequences, said excited magnetic resonance signals being characterized by a frequency band, means for generating a reference signal having a frequency in the neighborhood of but outside said frequency band, a receiver section for detecting received magnetic resonance signals within said frequency band by mixing said received magnetic resonance signals with said reference signal to form demodulated magnetic resonance signals and a sampling circuit for sampling the demodulated magnetic resonance signals, the frequency of the sampling circuit being chosen so tha the frequency band of the sampled demodulated magnetic resonance signal is situated to only one side of the frequency 0 Hz, and means for retaining synchronization of phase information in the sampled demodulated magnetic resonance signals in the successive measurement sequences.

2. A magnetic resonance imaging device as claimed in claim 1, characterized in that the transmitter/receiver is a hybrid transmitter/receiver, the transmitter section comprising a digital frequency synthesizer, a digital-toanalog converter, a transmission frequency mixing stage for mixing with the output of a phase locked loop oscillator, and an r.f. power amplifier which are connected in cascade, the receiver section comprising a preamplifier, a reception frequency mixing stage for mixing with said reference signal, and an analog-to-digital converter which are connected in cascade, said means for generating the reference signal being either the output of the phase locked loop oscillator the output of the transmission frequency mixing stage.

3. A magnetic resonance imaging device as claimed in claim 2, characterized in that the digital frequency synthesizer comprises a memory in which a sinusoidal waveform is stored in a table, an address input thereof being connected to an output of an adder circuit, add inputs of which are connected to an output of a further adder circuit and a first register, respectively, a first input of said further adder circuit being connected to a second register and to the output of the former adder circuit.

4. A magnetic resonance imaging device as claimed in claim 3, characterized in that the output of the memory is connected to the input of a digital-to-analog converter via a multiplier circuit, an input of the multiplier circuit being connected to a third register.

5. A magnetic resonance imaging device as claimed in claim 3 or 4, characterized in that inputs of the first, the second and the third register are connected to outputs of a control unit for adjusting the frequency, phase and amplitude of a signal to be applied to the digital-to-analog converter.

6. A magnetic resonance imaging apparatus as claimed in claim 2, 3, or 4, characterized in that the sampling frequency of the analog-to-digital converter is lower than the frequency band of the output signal of the reception frequency mixing stage.

7. A magnetic resonance imaging apparatus as claimed in claim 2 or, further comprising a processing-/control device for processing the detected resonance signals and for controlling the transmitter/receiver and the magnet system and characterized in that the analog-to-digital converter of the receiver is connected, via a Fourier transformation circuit, to a first correction circuit, a further input of which is connected to the processing/control unit in order to receive a phase correction signal.

8. A magnetic resonance imaging apparatus as claimed in claim 7, characterized in that the output of the phase correction circuit is connected to an arithmetic circuit for determining a mean value from associated frequency signals.

9. A magnetic resonance imaging device as claimed in claim 2, 3, or 4, wherein said generating means generates a reference signal having first and second phases and characterized in that the transmission frequency mixing stage is a single-sideband modulator which comprises a first and a second multiplier whose outputs are connected to an adder circuit, a first output of the first and the second multiplier receiving the reference signal having the first phase and the second phase, respectively, the difference between the first and second phases being 90°, a second input of the first multiplier and the second multiplier receiving a first and a second signal, respectively, from the digital synthesizer, the phase difference between the signals on the second inputs of the multipliers amounting to 90°, and one of the signals supplied by the synthesizer being invertable.

10. A magnetic resonance imaging device as claimed in claim 1, 2 or 3, wherein the receiver section has a state in which it is activated for the reception of magnetic resonance generated with the transmission frequency, signals excited by said transmission section and wherein a jump is made in the frequency of said reference frequency signal upon activation of said state.

* * * * *

UNITED STATES PATENT AND TRADEMARK OFFICE
CERTIFICATE OF CORRECTION

PATENT NO. : 4,879,514

DATED : November 7, 1989

INVENTOR(S) : Mehlkopf et al

It is certified that error appears in the above-identified patent and that said Letters Patent is hereby corrected as shown below:

Col. 1, line 55, after "Hz" insert --;--(semi-colon);
Col. 8, line 59, claim 1, change "tha" to --that--;
Col. 9, line 8, claim 2, the balance of the claim after "being" should not be indented; and
line 10, before "the output" insert --or--;
Col. 10, lines 30-38, claim 10 should read
--10. A magnetic resonance imaging device as claimed in claim 1, 2 or 3 wherein the receiver section has a state in which it is activated for the reception of magnetic resonance signals excited by said transmission section and wherein a jump is made in the frequency of said reference frequency signal upon activation of said state.--

Signed and Sealed this

Thirtieth Day of April, 1991

Attest:

HARRY F. MANBECK, JR.

Attesting Officer

Commissioner of Patents and Trademarks